United States Patent
Kikui

(10) Patent No.: US 8,088,536 B2
(45) Date of Patent: Jan. 3, 2012

(54) FUEL CELL SEPARATOR AND METHOD FOR MANUFACTURING THE SAME

(75) Inventor: Fumiaki Kikui, Suita (JP)

(73) Assignee: Neomax Materials Co., Ltd., Suita-shi, Osaka (JP)

( * ) Notice: Subject to any disclaimer, the term of this patent is extended or adjusted under 35 U.S.C. 154(b) by 919 days.

(21) Appl. No.: 11/662,205

(22) PCT Filed: Sep. 8, 2005

(86) PCT No.: PCT/JP2005/016547
§ 371 (c)(1),
(2), (4) Date: Mar. 8, 2007

(87) PCT Pub. No.: WO2006/028184
PCT Pub. Date: Mar. 16, 2006

(65) Prior Publication Data
US 2008/0107928 A1    May 8, 2008

(30) Foreign Application Priority Data

Sep. 10, 2004  (JP) ................................. 2004-264546

(51) Int. Cl.
*H01M 8/02* (2006.01)
*H01M 2/14* (2006.01)
*C23C 14/32* (2006.01)
*H01M 8/10* (2006.01)

(52) U.S. Cl. .... 429/535; 429/518; 427/115; 204/192.15

(58) Field of Classification Search .................... 429/34, 429/518, 535; 204/192.15, 192.17, 192.3; 148/286, 287; 427/115
See application file for complete search history.

(56) References Cited

U.S. PATENT DOCUMENTS

| | | | |
|---|---|---|---|
| 5,942,350 A | 8/1999 | Roy et al. | |
| 6,174,610 B1* | 1/2001 | Ohmi | 428/469 |
| 2002/0004158 A1* | 1/2002 | Suzuki et al. | 429/34 |
| 2002/0187379 A1 | 12/2002 | Yasuo et al. | |
| 2003/0064273 A1* | 4/2003 | Ohtani et al. | 429/34 |
| 2003/0175576 A1* | 9/2003 | Ohtani et al. | 429/38 |
| 2004/0170881 A1* | 9/2004 | Nakata | 429/34 |

(Continued)

FOREIGN PATENT DOCUMENTS

JP    54093639 A  *  7/1979

(Continued)

OTHER PUBLICATIONS

International Search Report for PCT/JP2005/016547 Dated Nov. 15, 2005.

*Primary Examiner* — Gregg Cantelmo
(74) *Attorney, Agent, or Firm* — Nixon Peabody LLP; Jeffrey L. Costellia

(57) ABSTRACT

There is provided a fuel cell separator having a very good anticorrosiveness and electrical conductivity. A fuel cell separator includes: a base formed of a steel which contains 10.5 mass % or more of Cr; a metal film formed on the surface of the base; and an intermediate layer formed between the base and the metal film, the intermediate layer containing oxygen. The metal film is composed of Au or Pt, and the intermediate layer contains Fe and Cr which are contained in the steel and Au or Pt composing the metal film.

5 Claims, 3 Drawing Sheets

U.S. PATENT DOCUMENTS

2004/0253501 A1* 12/2004 Ohtani et al. .................. 429/34
2005/0100771 A1* 5/2005 Vyas et al. ..................... 429/32

FOREIGN PATENT DOCUMENTS

| JP | 10-068071 | 3/1998 |
| JP | 10228914 A * | 8/1998 |
| JP | 11-162479 | 6/1999 |
| JP | 2000-164228 | 6/2000 |
| JP | 2001-192861 | 7/2001 |
| JP | 2001351642 A * | 12/2001 |
| JP | 2002-313355 | 10/2002 |
| JP | 2003-187817 | 7/2003 |

* cited by examiner

FUEL CELL SEPARATOR AND METHOD FOR MANUFACTURING THE SAME

TECHNICAL FIELD

The present invention relates to a separator for a fuel cell, and in particular to a separator which is suitable for a polymer electrolyte fuel cell to be used in power sources for automobiles, power sources for mobile devices, distributed generation sources, and the like.

BACKGROUND ART

Vigorous research activities are being directed to fuel cells as a next-generation energy source, due to their high generation efficiency and low burden on the environment.

A fuel cell is a power generation device in which hydrogen as a fuel and oxygen are allowed to undergo an electrochemical reaction, from which electric energy is elicited. Depending on the type of electrolyte used, fuel cells are classified into: the Solid Oxide Fuel Cell (SOFC); the Molten Carbonate Fuel Cell (MCFC); the Phosphoric Acid Fuel Cell (PAFC); the Polymer Electrolyte Fuel Cell (PEFC); and the Direct Methanol Fuel Cell (DMFC). Among others, PEFCs and DMFCs have operating temperatures as low as about 70 to 90° C. (as compared with other types of fuel cells), and enable a highly-efficient power generation even at about 1 kW (PEFC) and about several hundred W (DMFC). Therefore, PEFCs and DMFCs are considered especially promising for applications such as automobiles, mobile devices, and the like. In particular, DMFCs are small-sized, and their applications in mobile devices are being vigorously studied.

Hereinafter, with reference to FIG. 3, the structure and principle of a polymer electrolyte fuel cell (PEFC) will be described as an example.

FIG. 3(a) is a perspective view schematically showing the structure of a cell (battery) portion, which is a minimum structural unit of a polymer electrolyte fuel cell (PEFC). FIG. 3(b) is a schematic diagram showing the principle behind a PEFC.

As shown in FIG. 3(a), a cell in a fuel cell includes an ion exchange membrane (solid polymer membrane) 11 in the middle, with two electrodes being disposed on its sides: a fuel electrode (hydrogen electrode, anode side) 12 and an air electrode (or oxygen electrode, cathode side) 13. The ion exchange membrane 11 is a membrane for allowing protons ($H^+$) to move from the fuel electrode 12 to the air electrode 13. It is often the case that the ion exchange membrane 11 has electrode catalyst layers 14a and 14b on both sides thereof, and thus the ion exchange membrane 11 and the electrode catalyst layers 14a and 14b are collectively referred to as a membrane electrode assembly (MEA) 20. On the outside of the fuel electrode 12 and the air electrode 13, separators 16a and 16b are provided via gaskets 15a and 15b, respectively. Thus, hydrogen (anode side) moves between the MEA 20 and the separator 16a, and oxygen (cathode side) moves between the MEA 20 and the separator 16b (see FIG. 3(b)). On the surface of the separators 16a and 16b, trenches are formed through which reaction gases of hydrogen and oxygen pass.

As shown in FIG. 3(b), at the anode side, hydrogen ($H_2$) is supplied through the trench in the surface of the separator 16a, and uniformly diffused into the electrode catalyst layer 14a by the action of the fuel electrode 12. On the electrode catalyst layer 14a, $H_2$ becomes $H^+$ through a reaction of formula (1) below, and passes through the ion exchange membrane 11 and moves to the electrode catalyst layer 14b on the cathode side. On the other hand, at the cathode side, oxygen ($O_2$) is supplied through the trench in the surface of the separator 16b, and uniformly diffused into the electrode catalyst layer 14b by the action of the air electrode 13. On the electrode catalyst layer 14b, a reaction of formula (2) below occurs between the $O_2$ having been diffused in this manner and the $H^+$ which has moved through the ion exchange membrane 11 from the anode side, whereby $H_2O$ is generated.

$$H_2 \rightarrow 2H^+ + 2e^- \ldots \qquad \text{formula (1)}$$

$$2H^+ + \tfrac{1}{2}O_2 + 2e^- \rightarrow H_2O \ldots \qquad \text{formula (2)}$$

At this time, power generation occurs due to the electrons ($e^-$) which are generated at the anode side. Therefore, the separator is required to efficiently supply reaction gases of oxygen and hydrogen to the electrode catalyst layer 14a.

Depending on the amount of electric power, a plurality of cells (unit cells) having the above construction may be layered so as to be used in the form of a stack. In this case, the separators will act as partitions between unit cells, and therefore are required to ensure that the gas (hydrogen) from the fuel electrode and the gas (oxygen) from the air electrode will not become mixed in between cells.

From these standpoints, a separator is required to have little gas permeability, a good electrical conductivity, a low contact resistance, a good anticorrosiveness, and so on. In particular, there emerge stronger and stronger anticorrosiveness and electrical conductivity requirements in the recent years. As an evaluation criterion of anticorrosiveness, it is proposed that "no rust should occur even if the separator is immersed for 1000 hours in a sulfuric acid solution whose pH is about 1". In particular, DMFCs are small-sized and therefore are required to have a good surface electrical conductivity.

As a separator material having such characteristics, carbon materials are generally used. However, carbon materials have poor toughness and are brittle, and therefore are difficult to process, thus resulting in a problem of high processing costs.

Therefore, instead of carbon materials, use of metal materials as separator materials has been proposed in the recent years, because metal materials are easy to process and incur low processing costs (Patent Documents 1 to 2).

Above all, Patent Document 1 discloses a separator for a polymer electrolyte fuel cell, in which an electrically conductive ceramic coating such as niobium nitride, molybdenum silicide, tantalum carbide, or the like is provided on the surface of a stainless steel or the like. In Patent Document 1, in order to enhance the electrical conductivity in the operating environment of a fuel cell (i.e., a temperature range from room temperature to near 150° C., vapor atmosphere), an electrically conductive ceramic having a low resistivity is used.

Patent Document 2 discloses a separator for a polymer electrolyte fuel cell, in which a conductive film is formed on the surface of a metal substrate. The Cr concentration at the surface of the metal substrate is enhanced to no less than 13% or no less than 20%. At the interface between the metal substrate and the conductive film, a Cr oxide layer is formed on the surface of the metal substrate, in order to enhance the anticorrosiveness in the operating environment of the battery (i.e., about 80° C. in a saturated vapor).

However, the separators which are obtained by these methods still have less than sufficient anticorrosiveness.

Other than the above, there have also been proposed separators in which a plating of a metal film, e.g., a platinum group element or gold, is provided on a stainless steel. Since an oxide coating (passivation coating) is generated on the surface of the stainless steel, in which the Cr contained in the steel has bound to the oxygen in the atmosphere, a good anticorrosiveness is obtained but there is a large contact resistance. This is not usable as a separator material as it is. Accordingly, it might be conceivable to coat the surface of the stainless steel with a precious metal which excels is both anticorrosiveness and electrical conductivity. However, adhesion between a passivation coating and a metal film is very poor, and therefore it is very difficult to directly form a metal film on the surface of a stainless steel. Therefore, a method has hitherto been performed in which, after completely removing the passivation coating by etching or the like, an underlying plating layer which contains a metal such as Ni is formed as necessary, and then a plating of a precious metal is provided.

[Patent Document 1] Japanese Laid-Open Patent Publication No. 11-162479

[Patent Document 2] Japanese Laid-Open Patent Publication No. 2002-313355

[Patent Document 3] Japanese Laid-Open Patent Publication No. 10-68071

DISCLOSURE OF INVENTION

Problems to be Solved by the Invention

However, there is a problem in that, if a separator which is obtained by the above method is used for a long time, it will deteriorate in anticorrosiveness, thus deteriorating the performance of the fuel cell. It is considered that this is because corrosive fluids will intrude through pinholes that are created in the metal film over long periods of use, thus allowing the surface of the stainless steel to be partially exposed. As a result, a local cell is created due to a potential difference between the stainless steel and the precious metal composing the metal film, thus promoting bimetallic corrosion (galvanic corrosion). Therefore, according to the above method, the aforementioned evaluation criterion for anticorrosiveness ("no rust should occur even if the separator is immersed for 1000 hours in a strong acid solution") cannot be satisfied.

Although separators for polymer electrolyte fuel cells have been illustrated above for example, the required characteristics of a separator, i.e., "good anticorrosiveness and electrical conductivity" are common not only to polymer electrolyte fuel cells, but also to other fuel cells.

The present invention has been made in view of the above circumstances, and an objective thereof is to provide a separator for a fuel cell having a very good anticorrosiveness and electrical conductivity.

Means for Solving the Problems

A separator for a fuel cell according to the present invention comprises: a base formed of a steel which contains 10.5 mass % or more of Cr; a metal film formed on a surface of the base; and an intermediate layer formed between the base and the metal film, the intermediate layer containing oxygen, wherein the metal film is composed of Au or Pt, and the intermediate layer contains Fe and Cr which are contained in the steel and Au or Pt composing the metal film.

In a preferred embodiment, a depth-direction profile showing an oxygen content in the intermediate layer has a local maximum.

In a preferred embodiment, a depth-direction profile showing an Au or Pt content in the intermediate layer decreases from the metal film toward the base and depth-direction profiles showing Fe and Cr contents in the intermediate layer increase from the metal film toward the base.

In a preferred embodiment, the steel further contains 5 to 16 mass % of Ni, and the intermediate layer contains: Fe, Cr, and Ni which are contained in the steel; and Au or Pt composing the metal film.

In a preferred embodiment, a depth-direction profile showing an Au or Pt content in the intermediate layer decreases from the metal film toward the base, and depth-direction profiles showing Fe, Cr, and Ni contents in the intermediate layer increases from the metal film toward the base.

In a preferred embodiment, the intermediate layer has a thickness of 0.050 μm or more when a thickness of the metal film is equal to or greater than 0.03 μm and less than 0.10 μm; the intermediate layer has a thickness of 0.030 μm or more when a thickness of the metal film is equal to or greater than 0.10 μm and less than 0.30 μm; and the intermediate layer has a thickness of 0.0020 μm or more when a thickness of the metal film is equal to or greater than 0.30 μm.

In a preferred embodiment, the steel is a stainless steel.

In a preferred embodiment, the steel is an austenite-type stainless steel or an austenite-ferrite-type stainless steel.

In a preferred embodiment, the fuel cell is a polymer electrolyte fuel cell.

A fuel cell according to the present invention comprises the aforementioned separator for a fuel cell.

A method of producing a separator for a fuel cell according to the present invention comprises a step of providing a base formed of a steel which contains 10.5 mass % or more of Cr, with an oxide layer being formed on at least a portion of a surface thereof, the oxide layer containing oxides of Fe and Cr; a step of, through an ion bombard process, removing a portion of the oxide layer so as to leave a portion of the oxide layer; a step of forming an intermediate layer containing an element contained in the oxide layer and an element composing the metal film; and a step of, by a vapor deposition technique, depositing a metal film on the intermediate layer.

In a preferred embodiment, through the ion bombard process, a portion is removed from the surface of the oxide layer to a depth of 0.0010 μm or more.

In a preferred embodiment, the step of forming the intermediate layer alternately performs a step of depositing the metal film and a step of performing an ion bombardment process.

In a preferred embodiment, the vapor deposition technique is a sputtering technique or an ion plating technique.

Effects of the Invention

In accordance with a separator for a fuel cell according to the present invention, between a base formed of a steel which contains 10.5 mass % or more of Cr and a metal film, an intermediate layer containing oxygen is formed, the intermediate layer containing Fe and Cr (and additionally Ni) which are contained in the steel and Au or Pt composing the metal film, and therefore, a good anticorrosiveness and electrical conductivity is provided.

Figure 1:
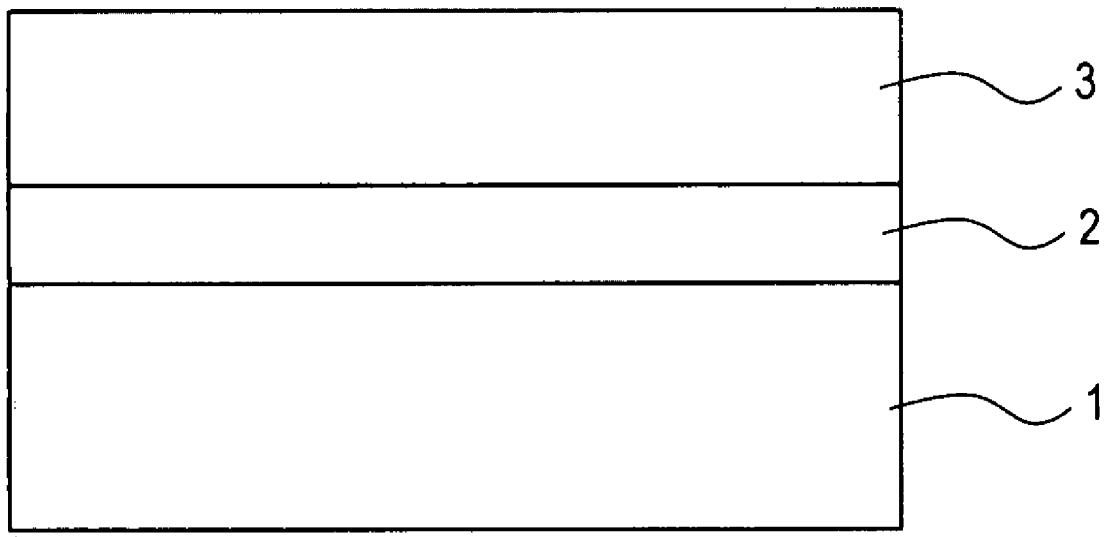
[FIG. 1] A cross-sectional view schematically showing the construction of a separator for a fuel cell according to the present invention.

DESCRIPTION OF THE REFERENCE NUMERALS 1 base
2 intermediate layer
3 metal film
11 ion exchange membrane (solid polymer membrane)
12 fuel electrode (hydrogen electrode)
13 air electrode (oxygen electrode)
14a, 14b electrode catalyst layer
15a, 15b gasket
16a, 16b separator

BEST MODE FOR CARRYING OUT THE INVENTION

With a view to providing a separator for a fuel cell which has a very good anticorrosiveness and also a good electrical conductivity, the inventors have paid attention to a base composed of a stainless steel having a metal film coated thereon, and conducted continued studies to further enhance the anticorrosiveness of the base. As a result, the inventors have concluded that the conventional method which forms a metal film after completely removing a passivation coating that is formed on the surface of a stainless steel makes it difficult to provide good anticorrosiveness for a long period of time, and that it is essential to make use of the passivation coating in order to obtain a desired anticorrosiveness.

However, as described earlier, there is very poor adhesion between a passivation coating and a metal film. Therefore, the inventors have conducted further studies concerning the method of depositing a metal film on a passivation coating. As a result, by adopting a method which "after using ion bombard process to remove a portion of a passivation coating (Fe/Cr/Ni oxide layer) which is formed on the surface of a stainless steel (i.e., a portion of the passivation coating remains unremoved), alternately performs etching of the underlying layer and deposition of a metal film", the inventors have succeeded in forming, between the stainless steel and the metal film, an intermediate layer which contains elements that are contained in the passivation coating. Moreover, unlike the conventional passivation coating, this intermediate layer contains not only elements that are contained in the passivation coating but also an element composing the metal film, and thus has a very good adhesion to the metal film. Therefore, the separator of the present invention exhibits both a good anticorrosiveness due to the passivation coating and a good anticorrosiveness and electrical conductivity due to Au or Pt, as well as a good adhesion between the intermediate layer and the metal film. Therefore, rust will not occur even if the separator of the present invention is immersed for 1000 hours or more in a sulfuric acid solution whose pH is about 1, and a very good anticorrosiveness will be maintained for a long time.

Thus, in its technological concept of "utilizing the good anticorrosiveness due to a passivation coating which is formed on the surface of a stainless steel", the present invention differs from the conventional technique which "completely removes the passivation coating". Conventionally, there has only been a concept that "since very poor adhesion exists between a passivation coating and a metal film, the passivation coating needs to be completely removed", thus totally lacking in the inventive concept of "utilizing the good anticorrosiveness due to the passivation coating". Therefore, no attempts have been made to coat a metal film on the surface of a stainless steel having a passivation coating formed thereon, while leaving a portion of the passivation coating. Note that Patent Document 1 discloses a metal coating comprising an electrically conductive ceramic dispersed on the surface of a stainless steel, and as metals composing the metal coating, exemplifies Au or Pt such as platinum group elements or gold. However, after much scrutiny of Patent Document 1, no disclosure is found of the present invention's technological concept of "enhancing anticorrosiveness by leaving a portion of the passivation coating", and not a single example of using Au or Pt is disclosed. Moreover, Patent Document 1 fails to disclose the unique inventive method of "after using ion bombard process to remove a portion of an Fe/Cr/Ni oxide layer while leaving a portion thereof, alternately performing etching of the underlying layer and deposition of a metal film", and therefore does not provide any intermediate layer which "contains both elements composing the passivation coating and an element composing the metal film" and which has good adhesion to the metal film.

Hereinafter, with reference to FIG. 1, an embodiment of the separator for a fuel cell according to the present invention will be described. FIG. 1 is a cross-sectional view schematically showing the construction of a separator for a fuel cell according to the present embodiment. As shown in FIG. 1, the separator for a fuel cell according to the present embodiment includes a base 1 formed of a steel which contains 10.5 mass % or more of Cr; a metal film 3 formed on the surface of the base 1; and an intermediate layer 2 formed between the base 1 and the metal film 3.

The base 1 is formed of a steel which contains 10.5 mass % or more of Cr (chromium). As described above, the separator for a fuel cell according to the present invention utilizes the good anticorrosiveness due to a passivation coating composed of Cr oxide or the like which is formed on the surface of a stainless steel. Therefore, a steel which contains at least Cr as an anticorrosiveness element is used. Although the anticorrosiveness is more improved as the Cr content increases, an excessive addition thereof will result in a reduced processibility. Therefore, it is preferable to keep the Cr content generally at 27 mass % or less. Preferably, the Cr content is no less than 13 mass % and no more than 25 mass %.

In order to further enhance the anticorrosiveness, it is preferable that 5 mass % or more of Ni (nickel) be contained. Although the anticorrosiveness is more improved as the Ni content increases, no improvement in anticorrosiveness will be obtained even if the addition is made in excess of 16 mass %, and only a cost increase will result. Therefore, it is preferable to add it under an upper limit of generally 16 mass %.

Other than that, in order to enhance characteristics such as anticorrosiveness and processibility, it is preferable that Cu (copper) be contained in a range of no more than about 3 mass % and that Mo (molybdenum silicide) be contained in a range of no more than about 5 mass %.

Moreover, C (carbon) is to be added in order to secure a predetermined strength, but will deteriorate the processability if added in large amounts, and therefore is preferably kept under 1.0 mass % or less.

The steel to be used in the present embodiment preferably contains the aforementioned elements, and the remainder thereof is Fe (iron) and inevitable impurities.

As a steel that satisfies such requirements, it is preferable to use a stainless steel.

Examples of stainless steels which do not contain (or substantially do not contain) Ni are ferrite-type stainless steels, martensite-type stainless steels, and the like. Ferrite-type stainless steels are steels which contain about 0.12 mass % or less of C and about 16 to 18 mass % of Cr, and representative examples thereof are 18 Cr-low carbon stainless steels such as SUS430 (JIS standard). Other examples are 18 Cr-1 Mo stainless steels such as SUS434 (JIS standard), 18 Cr-2 Mo—Ti/Nb/Zr-ultralow (C, N) stainless steels such as SUS444 (JIS standard), and the like. Martensite-type stainless steels are steels which contain about 0.1 to 0.4 mass % of C and about 12 to 18 mass % of Cr, and representative examples thereof are 13 Cr-low carbon stainless steels such as SUS410 (JIS standard), 18 Cr-high carbon stainless steels such as SUS440 (JIS standard), and the like.

Examples of stainless steels which contain Ni are austenite-type stainless steels, binary (austenite-ferrite) stainless steels, and the like. Austenite-type stainless steels are steels which contain about 0.15 mass % or less of C, about 16 to 20 mass % of Cr, and about 18 mass % or more of Ni, and representative examples thereof are 18 Cr-8 Ni-low carbon stainless steels such as SUS304, 18 Cr-12 Ni-2.5 Mo stainless steels such as SUS316, and the like. Examples of binary stainless steels are 25 Cr-4.5 Ni-2 Mo stainless steels such as SUS329J1, and the like. Examples of martensite-type stainless steels containing Ni are 16 Cr-2 Ni stainless steels such as SUS431, and the like.

Among the above, in terms of having a particularly good anticorrosiveness, austenite-type stainless steels and binary stainless steel (which contain Ni within the steel) are preferable, the austenite-type stainless steels being more preferable.

The intermediate layer 2 contains oxygen. More particularly, the intermediate layer 2 contains: Fe and Cr (in the case where the steel contains Cr and contains substantially no Ni); or Fe, Cr and Ni (in the case where the steel contains Cr and Ni), which are mainly contained in the steel, and the intermediate layer 2 also contains Au or Pt composing the metal film 3. Among these, it is considered that Fe and Cr (and additionally Ni) bind to oxygen to mainly generate Fe oxide and Cr oxide (and additionally Ni oxide), respectively. A layer containing the above oxides corresponds to a passivation coating which is formed on the surface of a stainless steel. In the present specification, within the intermediate layer 2, any layer that contains the above oxides may be collectively referred to as an "Fe/Cr/Ni oxide layer".

As will be described later, in the separator of the present invention, before depositing the metal film 3, an ion bombard process is performed to remove a portion of an Fe/Cr/Ni oxide layer while leaving a portion thereof, and also a bias voltage or the like is varied within a predetermined range, whereby deposition of the metal film and removal of the underlying layer are alternately performed. Therefore, in the intermediate layer 2, not only the main elements composing the Fe/Cr/Ni oxide layer but also Au or Pt (described later) that composes the metal film is deposited. The Au or Pt contained in the intermediate layer exists in the form of a metallic element, rather than as an oxide or the like.

Depth-direction profiles showing the contents of the above elements in the intermediate layer 2 are as follows. First, a depth-direction profile showing the oxygen content has a local maximum, and decreases toward the metal film 3 and toward the base 1. On the other hand, depth-direction profiles showing the Fe and Cr (and additionally Ni) contents increase from the metal film 3 toward the base 1, and a depth-direction profile showing the Au or Pt content decreases from the metal film 3 toward the base 1.

Figure 2:
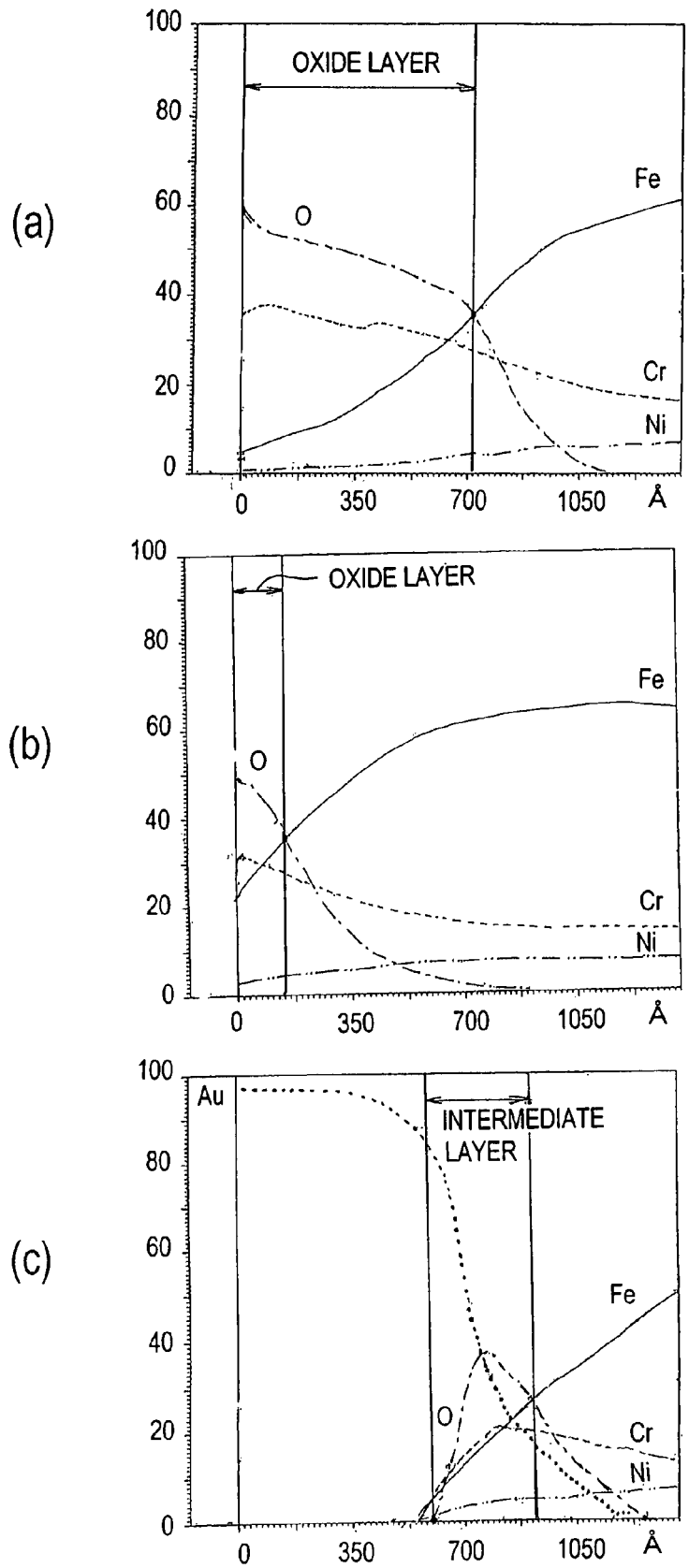
[FIG. 2] Diagrams for describing element distributions in an intermediate layer along the depth direction, during a process of forming an intermediate layer in a production method for the separator according to an embodiment of the present invention, where: (a) is a graph showing an element distribution along the depth direction in an Fe/Cr/Ni oxide layer which is obtained through step 1 of the intermediate layer-forming process; (b) is a graph showing an element distribution along the depth direction in an Fe/Cr/Ni oxide layer which is left from step 2; and (c) is a graph showing an element distribution along the depth direction of the intermediate layer obtained through step 3.
Figure 3:
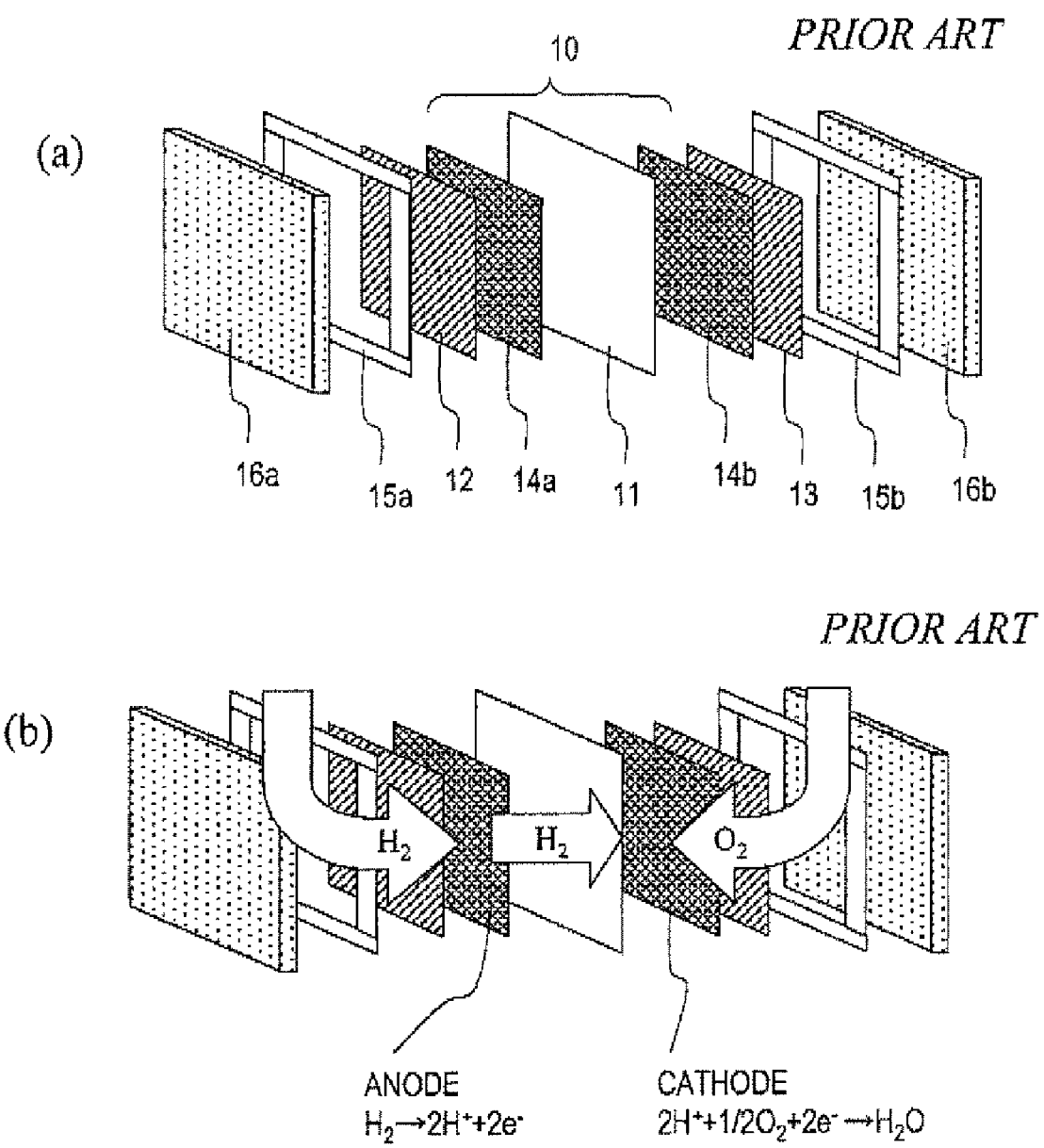
[FIG. 3] (a) is a perspective view schematically showing the structure of a cell (battery) portion, which is a minimum structural unit of a polymer electrolyte fuel cell (PEFC); and (b) is a schematic diagram showing the principle behind a PEFC.

With reference to FIG. 2, element distributions in the intermediate layer along the depth direction will be described. Herein, in order to examine how elements composing the intermediate layer change with the process of forming the intermediate layer (steps 1 to 3 below), elements in the layer obtained in each step were analyzed along the depth direction.

First, a base formed of SUS304 steel was provided, and was heated at 800° C. for 10 minutes in the atmosphere. As a result, an Fe/Cr/Ni oxide layer having a thickness of 0.070 μm was formed on the surface of the base (step 1).

Next, the base having the aforementioned oxide layer formed thereon was placed in an arc ion plating apparatus, which was evacuated until reaching a vacuum of $2 \times 10^{-3}$ Torr. Thereafter, an Ar gas was introduced, and by using Au as a target, an ion bombard process was performed while applying a bias voltage of −300 V, whereby a portion was removed, to a depth of 0.055 μm, from the surface of the Fe/Cr/Ni oxide layer. As a result, an Fe/Cr/Ni oxide layer having a thickness of 0.015 μm was left on the surface of the base (step 2).

Thereafter, the base was heated to 200° C., and Au was deposited while setting the bias voltage to −80 V and a portion of the underlying layer was removed while setting the bias voltage to −180 V. Thus, deposition of the Au film and removal of the underlying layer were alternately performed, thereby obtaining an intermediate layer (thickness: 0.028 μm) in which Au was deposited to a thickness of 0.06 μm (step 3).

The element distribution in each of the layers obtained from steps 1 to 3 along the depth direction was measured by Electron Spectroscopy for Chemical Analysis (ESCA). Specifically, "ESCA-850" manufactured by Shimadzu Corporation was used, and measurements were taken while irradiating each layer with MgK α (8.0 kV, 30 mA), which is the characteristic X ray of Mg (ion gun Ar, 2.0 kV, 20 mA).

These results are shown in FIGS. 2(a) to (c).

In each figure, the horizontal axis shows thickness (Å) along the depth direction of each of the layers obtained from steps 1 to 3, whereas the vertical axis shows the Fe, Cr, Ni, and O (oxygen) contents (mass %) composing the layer. In FIGS. 2(a) and (b), a distance from the surface (horizontal axis=0) to a point where a depth-direction profile showing the O content and a depth-direction profile showing the Fe content intersect each other was defined as the "thickness of the Fe/Cr/Ni oxide layer". In FIG. 2(c), a distance from a point (near the surface) where a depth-direction profile showing the O content intersects the horizontal axis to a point where the depth-direction profile showing the O content intersects a depth-direction profile showing the Fe content was defined as the "thickness of the intermediate layer". Moreover, a distance from the surface (horizontal axis=0) to a point (near the surface) where the depth-direction profile showing the O content intersects the horizontal axis was defined as the "thickness of the Au film".

Note that a production method for the separator according to the present invention comprises, after step 3, a step of depositing an Au film to a predetermined thickness by vapor deposition technique. However, even after the addition of this step, the element distribution in the intermediate layer along the depth direction hardly changes from the element distribution in the intermediate layer obtained from step 3. Therefore, the Au film depositing step is omitted herein.

FIG. 2(a) is a graph showing an element distribution along the depth direction in the Fe/Cr/Ni oxide layer which is obtained through step 1. By heating, mainly oxides of Cr are formed near the surface of the oxide layer.

FIG. 2(b) is a graph showing an element distribution along the depth direction in the Fe/Cr/Ni oxide layer which is left from step 2. By an ion bombard process, about 4/5 of the Fe/Cr/Ni oxide layer formed in step 1 is removed, and oxides of Cr as well as oxides of Fe are formed abundantly near the surface of the remaining oxide layer.

FIG. 2(c) is a graph showing an element distribution along the depth direction of the intermediate layer obtained through step 3. As shown in FIG. 2(c), the depth-direction profile showing the oxygen content has a local maximum, and decreases toward the metal film 3 and toward the base 1. On the other hand, the depth-direction profiles showing the Fe, Cr, and Ni contents and the depth-direction profile showing the Au content have opposite tendencies, such that the former increase from the metal film 3 toward the base 1, while the latter decreases from the metal film 3 toward the base 1. Thus, by alternately performing deposition of the Au film and removal of the underlying layer while varying the bias voltage, an intermediate layer is formed which contains elements that are contained in the oxide layer as well as Au. Since such an intermediate layer has a good anticorrosiveness and also a good adhesion with the subsequently-deposited Au film, a separator for a fuel cell including the intermediate layer has a very good anticorrosiveness.

The intermediate layer 2 of such a construction preferably has a thickness of 0.050 μm or more when the thickness of the metal film 3 is equal to or greater than 0.03 μm and less than 0.10 μm, and preferably has a thickness of 0.030 μm or more when the thickness of the metal film 3 is equal to or greater than 0.10 μm and less than 0.30 μm. Moreover, when the thickness of the metal film 3 is equal to or greater than 0.3 μm, the intermediate layer 2 preferably has a thickness of 0.0020 μm or more, and a sufficient anticorrosiveness will not be obtained if the thickness of the intermediate layer 2 is less than 0.0020 μm. More preferably, it is 0.010 μm or more, and further more preferably 0.020 μm or more. Although the anticorrosiveness is more improved as the thickness of the intermediate layer 2 increases, if it is too thick, a long time will be required for forming the intermediate layer, which is unpractical. Therefore, the upper limit of the thickness of the intermediate layer may be determined from the standpoint of producibility rather than anticorrosiveness, and preferably has a thickness of 0.1 μm or less, for example.

The metal film 3 is composed of Au or Pt. Since Pt is an expensive metal, the most preferable precious metal is Au, in terms of cost.

The metal film 3 preferably has a thickness of 0.03 μm or more. If the thickness of the metal film 3 is less than 0.03 μm, the desired anticorrosiveness cannot be obtained. More preferably, it is 0.05 μm or more, and further more preferably 0.10 μm or more. Although the anticorrosiveness is more improved as the thickness of the metal film 3 increases, if it is too thick, a long time will be required for forming the metal film 3, which is unpractical. Therefore, the upper limit of the thickness of the metal film 3 may be determined from the standpoint of producibility rather than anticorrosiveness, and preferably has a thickness of 1.5 μm or less, for example. In order to obtain a good anticorrosiveness when used as a separator, it is preferable that at least the portion which is in contact with the electrolyte is coated with the metal film 3.

According to the production method of the present invention, a vapor-deposited film 3 of a precious metal which has a very good adhesion with the intermediate layer 2 is obtained.

Next, a method for producing the separator for a fuel cell according to the present invention will be described.

The production method of the present invention comprises: a step of providing a base such that an Fe/Cr/Ni oxide layer is formed on at least a portion of the surface of the base, the base being formed of a steel which contains 10.5 mass % or more of Cr (and which may additionally contain Ni; hereinafter may be referred to as a "Cr/Ni-containing steel"); a step of removing a portion of the Fe/Cr/Ni oxide layer so as to leave a portion of the oxide layer by an ion bombard process; a step of forming an intermediate layer containing elements contained in the oxide layer and an element contained in the metal film; and a step of depositing a metal film on the intermediate layer by vapor deposition technique.

Before describing the respective steps in detail, the "vapor deposition technique" will first be described.

In the present specification, a "vapor deposition technique" broadly encompasses any method that allows the substance-to-be-deposited (i.e., a precious metal in the present invention) to be deposited in a gaseous state, and includes physical vapor deposition technique and CVD (chemical vapor deposition) technique. In the present invention, it is more preferable to use physical vapor deposition technique as the vapor deposition technique. In particular, since films that are formed by ion plating technique and sputtering technique are generally dense, the metal film is more preferably formed by ion plating technique or sputtering technique.

Examples of ion plating technique include activated reactive evaporation technique, high-frequency excitation technique, hollow cathode discharge technique, arc evaporation technique (arc ion plating technique), and the like. In the case of using sputtering technique, a DC sputtering apparatus, an RF sputtering apparatus, a magnetron sputtering apparatus, an ion beam sputtering apparatus or the like may be used.

First, a base is provided such that an Fe/Cr/Ni oxide layer is formed on at least a portion of the surface of the base, the based being formed of a Cr/Ni-containing steel. Such a base may be a commercially-available product, or a base which is formed of a Cr/Ni-containing steel may be heated to form an Fe/Cr/Ni oxide layer.

A preferable thickness of the Fe/Cr/Ni oxide layer is about 0.0030 to 0.20 μm. Since a portion (about 0.0010 μm or more) of the oxide layer is to be subsequently removed by an ion bombard process, it is preferable that the oxide layer is slightly thicker than the thickness (about 0.0020 to 0.1 μm) of the intermediate layer that is finally obtained. As the specific heating conditions, appropriate conditions may be set so that a desired thickness is obtained, in accordance with the type of base used or the type of precious metal composing the metal film, the conditions of the ion bombard process, and the like. However, generally speaking, a heating at 500 to 800° C. for 0.02 to 0.5 hours is preferable. The aforementioned heat treatment is preferably performed within a vapor deposition apparatus which is used for the subsequent ion bombard process and metal film depositing process, whereby the series of processes can be efficiently performed.

Next, an ion bombard process is performed for the Fe/Cr/Ni oxide layer. In the present invention, it is necessary to perform the ion bombard process so that a portion of the Fe/Cr/Ni oxide layer is removed but a portion thereof remains. As a result, the good anticorrosiveness due to the Fe/Cr/Ni oxide layer can be effectively exhibited.

The ion bombard process (metal ion bombard process) is a kind of removal of a coating (etching), which is performed to obtain a thin film having a good adhesion, and is performed by allowing metal ions (i.e., precious metal ions in the present embodiment) to collide with a material which is subjected to deposition. By performing an ion bombard process, an metal film can be deposited on the Fe/Cr/Ni oxide layer with a good adhesion.

Specifically, the ion bombard process is performed as follows. First, an Ar gas is introduced into a vacuum container which is adjusted to a range of about 1 to $3\times10^{-3}$ Torr (about 133 to 399 Pa), and while applying a negative bias voltage (about −150 to −180 V or even greater) to the material which is subjected to deposition (i.e., the base with the Fe/Cr/Ni oxide layer formed thereon), cations of a precious metal are generated through evaporation from a precious metal target (cathode). Due to the negative bias voltage which is applied to the material subjected to deposition, the ions will collide with the material subjected to deposition, whereby the surface of the material subjected to deposition is sputtered. Herein, it is preferable that a portion to a depth of about 0.0010 μm is finally removed from the surface of the Fe/Cr/Ni oxide layer, while paying particular attention to the bias voltage which is applied to the substrate. The reason is that the bias voltage is considered to greatly affect the speed of removal (etching rate) of the Fe/Cr/Ni oxide layer, the surface attributes after the ion bombard process, and the like, thus affecting the adhesion between the Fe/Cr/Ni oxide layer and the metal film. The oxide layer cannot be efficiently removed if the bias voltage is less than about −150 V. There is no particular upper limit to the bias voltage, which may be appropriately set in accordance with the apparatus used.

Note that a general outline of the ion bombard process is specifically described in Patent Document 3, for example, and thus Patent Document 3 and the like may be referred to for details of the apparatus and the like. The entire disclosure of Patent Document 3 is incorporated herein by reference.

Next, an intermediate layer which contains elements contained in the Fe/Cr/Ni oxide layer and an element composing the metal film is formed. In the present embodiment, by using the same apparatus as that used for the above-described ion bombard process, the intermediate layer is formed by alternately performing a step of depositing the metal film and a step of etching the underlying layer through an ion bombardment process. Specifically, the intermediate layer is preferably formed by varying the bias voltage as follows. Preferably, Au or Pt is first deposited while applying a bias voltage in a range of about −75 to −85V for about 10 to 20 seconds, and thereafter a portion of the underlying layer (including a portion of the Au or Pt which has been deposited in the above manner) is removed while applying for about 5 to 15 seconds a bias voltage which is controlled to a range of about −150 V or greater. Such a series of operations is preferably repeated a plurality of times (about 3 to 10 times), whereby a desired thickness of the intermediate layer can be obtained. When the above operations are to be repeated a plurality of times, the bias voltage when etching a portion of the underlying layer may be changed each time within the aforementioned range. For example, the bias voltage may be sequentially decreased, e.g., about −170 V for the first etching, −160 V for the second etching, −150 V for the third etching, and so on.

In order to efficiently perform the above operations, it is preferable to pre-heat the material which is subjected to deposition to a temperature of about 150 to 250%.

Finally, on the intermediate layer which has been formed in the above manner, a metal film is deposited by vapor deposition technique.

The specific film-forming conditions may vary depending on the type of vapor deposition technique used. However, a method of depositing a metal film by using arc ion plating technique may be as follows, for example.

First, within a vacuum container which is adjusted to a range of about 2 to $5\times10^{-3}$ Torr (about 266 to 665 Pa), a reaction gas such as a nitrogen gas, an oxygen gas, or an inert gas is introduced, and a negative bias voltage is applied to the material subjected to deposition (i.e., the aforementioned intermediate layer), thus performing an arc discharge to evaporate the cathode material. The bias voltage to be applied to the material subjected to deposition is preferably smaller than when performing the ion bombard process, whereby a metal film is deposited on the surface of the material subjected to deposition. The bias voltage to be applied is preferably −60 to −70 V to permit efficient deposition of the metal film. The metal film cannot be efficiently deposited if the bias voltage is less than −60 V. On the other hand, if the bias voltage exceeds −70 V, the surface roughness will become very large, thus inviting surface defects such as pinholes.

The separator for a fuel cell according to the present invention, which has been produced in this manner, is particularly suitably used for a polymer electrolyte fuel cell.

EXAMPLES

In the following Experimental Examples, with respect to materials in which the surface of a base formed of a stainless steel was coated with various intermediate layers and metal films, anticorrosiveness and electrical conductivity were evaluated (Experimental Examples 1 to 3). For comparison, conventional examples (Comparative Examples 1 to 3) in which the oxide layer formed on the surface of a base was completely removed, and comparative examples (Comparative Examples 4 to 5) in which the oxide layer and metal film were reduced in thickness were produced, and their anticorrosiveness and electrical conductivity were evaluated similarly to the Experimental Examples above (Comparative Examples 1 to 5).

The details of the evaluation method are as follows.

[Anticorrosiveness]

Each material was immersed in a sulfuric acid solution (35° C.) at pH1. The rust generation in 1000 hours and 1500 hours after immersion was observed with a stereomicroscope (magnification×30). In the present specification, "good anticorrosiveness" is characterized by the absence of rust after 1000 hours of immersion in a sulfuric acid solution at pH 1.

[Electrical Conductivity]

By using "196 System DMM" manufactured by KEITHLEY Instruments, Inc., the surface resistance of each material was measured.

In the present specification, "good electrical conductivity" is characterized by the surface resistance of a material as measured by the above method satisfying the range of 0.01 to 0.03Ω.

Note that the thicknesses of the intermediate layer and metal film formed on the surface of the base were both measured by the aforementioned ESCA technique.

Experimental Example 1

In this Experimental Example, a material was produced such that the surface of a base formed of a stainless steel was coated with an intermediate layer containing elements composing the Fe/Cr/Ni oxide layer and Au (thickness: 0.015 μm) and with an Au film (thickness: 0.8 μm).

First, a base formed of SUS304 steel (80 mm long×80 mm wide×1.0 mm thick) was provided, and heated at 800° C., for 3 minutes in the atmosphere. As a result, on the surface of the base, an Fe/Cr/Ni oxide layer having a thickness of 0.020 µm was formed.

Next, the base having the oxide layer formed on its surface was placed in an arc ion plating apparatus, which was evacuated to a vacuum. An Ar gas was introduced, and at a gas pressure of $2 \times 10^{-3}$ Torr (about $266 \times 10^{-3}$ Pa), by using Au as a target, an ion bombard process was performed while applying a bias voltage of −300 V. Thus, a portion was removed, to a depth of 0.010 µm, from the surface of the Fe/Cr/Ni oxide layer. As a result, an Fe/Cr/Ni oxide layer having a thickness of 0.010 µm was left on the surface of the base.

Thereafter, the base was heated to 200° C., and Au was deposited through 15 seconds of application of a bias voltage which was set to −80 V, and a portion of the underlying layer was removed through 5 seconds of application of a bias voltage which was set to −180 V. Thus, deposition of the Au film and removal of the underlying layer were alternately performed. Such a series of operations was carried out six times. As a result, an intermediate layer in which Au was deposited to a thickness of 0.05 µm was obtained (thickness of the intermediate layer: 0.015 µm).

Finally, while applying a bias voltage of −70 V, an Au film having a thickness of 0.8 µm was deposited.

Experimental Example 2

In this Experimental Example, the method of Experimental Example 1 was modified so as to produce a material such that the surface of a base formed of a stainless steel was coated with an intermediate layer containing elements composing the Fe/Cr/Ni oxide layer and Au (thickness: 0.008 µm) and with an Au film (thickness: 0.5 µm).

First, except that the heating time was reduced to 1.5 minutes, a heating was performed similarly to Experimental Example 1, thereby forming an Fe/Cr/Ni oxide layer having a thickness of 0.010 µm on the surface of a base formed of SUS304 steel.

Next, an ion bombard process was performed similarly to Experimental Example 1, thereby removing a portion, to a depth of 0.005 µm, from the surface of the Fe/Cr/Ni oxide layer. Therefore, an Fe/Cr/Ni oxide layer having a thickness of 0.005 µm was left on the surface of the base.

Thereafter, the bias voltage was varied similarly to Experimental Example 1, whereby an intermediate layer in which 0.03 µm of an Au film was deposited was obtained (thickness of the intermediate layer: 0.008 µm).

Finally, while applying a bias voltage of −65V, an Au film having a thickness of 0.5 µm was deposited.

Experimental Example 3

In this Experimental Example, the method of Experimental Example 1 was modified so as to produce a material such that the surface of a base formed of a stainless steel was coated with an intermediate layer containing elements composing the Fe/Cr/Ni oxide layer and Pt (0.015 µm) and with a Pt film (1.2 µm).

First, except that the heating time was prolonged to 4 minutes, a heating was performed similarly to Experimental Example 1, thereby forming an Fe/Cr/Ni oxide layer having a thickness of 0.025 µm on the surface of a base formed of SUS304 steel.

Next, except that a Pt target was used, an ion bombard process was performed similarly to Experimental Example 1, thereby removing a portion, to a depth of 0.010 µm, from the surface of the Fe/Cr/Ni oxide layer. Therefore, an Fe/Cr/Ni oxide layer having a thickness of 0.015 µm was left on the surface of the base.

Thereafter, the bias voltage was varied similarly to Experimental Example 1, whereby an intermediate layer in which a Pt film having a thickness of 0.05 µm was deposited was obtained (thickness of the intermediate layer: 0.020 µm).

Finally, while applying a bias voltage of −70V, a Pt film having a thickness of 1.2 µm was deposited.

Experimental Example 4

In this Experimental Example, the method of Experimental Example 1 was modified so as to produce a material such that the surface of a base formed of a stainless steel was coated with an intermediate layer containing elements composing the Fe/Cr/Ni oxide layer and Au (thickness: 0.060 µm) and with an Au film (thickness: 0.050 µm).

First, except that the heating time was reduced to 1.5 minutes, a heating was performed similarly to Experimental Example 1, thereby forming an Fe/Cr/Ni oxide layer having a thickness of 0.070 µm on the surface of a base formed of SUS304 steel.

Next, an ion bombard process was performed similarly to Experimental Example 1, thereby removing a portion, to a depth of 0.010 µm, from the surface of the Fe/Cr/Ni oxide layer. Therefore, an Fe/Cr/Ni oxide layer having a thickness of 0.060 µm was left on the surface of the base.

Thereafter, the bias voltage was varied similarly to Experimental Example 1, whereby an intermediate layer in which 0.010 µm of an Au film was deposited was obtained (thickness of the intermediate layer: 0.065 µm).

Finally, while applying a bias voltage of −65V, an Au film having a thickness of 0.050 µm was deposited.

Experimental Example 5

In this Experimental Example, the method of Experimental Example 1 was modified so as to produce a material such that the surface of a base formed of a stainless steel was coated with an intermediate layer containing elements composing the Fe/Cr/Ni oxide layer and Au (0.035 µm) and with an Au film (0.12 µm).

First, except that the heating time was prolonged to 4 minutes, a heating was performed similarly to Experimental Example 1, thereby forming an Fe/Cr/Ni oxide layer having a thickness of 0.040 µm on the surface of a base formed of SUS304 steel.

Next, except that an Au target was used, an ion bombard process was performed similarly to Experimental Example 1, thereby removing a portion, to a depth of 0.010 µm, from the surface of the Fe/Cr/Ni oxide layer. Therefore, an Fe/Cr/Ni oxide layer having a thickness of 0.030 µm was left on the surface of the base.

Thereafter, the bias voltage was varied similarly to Experimental Example 1, whereby an intermediate layer in which an Au film having a thickness of 0.05 µm was deposited was obtained (thickness of the intermediate layer: 0.035 µm).

Finally, while applying a bias voltage of −70V, a Pt film having a thickness of 0.12 µm was deposited.

Comparative Example 1

Except that a bias voltage of −400 V was applied and the Fe/Cr/Ni oxide layer was completely removed in the ion bombard process of Experimental Example 1, a similar processing to that of Experimental Example 1 was performed, thereby producing a material such that the surface of a base formed of a stainless steel was coated with an Au film (thickness: 0.8 μm).

Comparative Example 2

Except that a bias voltage of −400 V was applied and the Fe/Cr/Ni oxide layer was completely removed in the ion bombard process of Experimental Example 2, a similar processing to that of Experimental Example 2 was performed, thereby producing a material such that the surface of a base formed of a stainless steel was coated with an Au film (thickness: 0.5 μm).

Comparative Example 3

Except that a bias voltage of −400 V was applied and the Fe/Cr/Ni oxide layer was completely removed in the ion bombard process of Experimental Example 3, a similar processing to that of Experimental Example 3 was performed, thereby producing a material such that the surface of a base formed of a stainless steel was coated with a Pt film (thickness: 1.2 μm).

Comparative Example 4

Except that a bias voltage of −320 V was applied and a portion of the Fe/Cr/Ni oxide layer was allowed to remain (thickness: 0.0011 μm) in the ion bombard process of Experimental Example 1, a similar processing to that of Experimental Example 1 was performed, thereby producing a material such that the surface of a stainless steel was coated with an intermediate layer containing elements composing the Fe/Cr/Ni oxide layer and Au (thickness: 0.0016 μm) and with an Au film (thickness: 0.8 μm).

Comparative Example 5

Except that the deposition time was reduced from 0.36 hours to 0.12 hours and an Au film having a thickness of 0.27 μm was deposited in Experimental Example 1, a similar processing to that of Experimental Example 1 was performed, thereby producing a material such that the surface of a base formed of a stainless steel was coated with an intermediate layer containing elements composing the Fe/Cr/Ni oxide layer and Au (thickness: 0.010 μm) and with an Au film (thickness: 0.27 μm).

Comparative Example 6

Except that a bias voltage of −320 V was applied and a portion of the Fe/Cr/Ni oxide layer was allowed to remain (thickness: 0.025 μm) in the ion bombard process of Experimental Example 5, a similar processing to that of Experimental Example 5 was performed, thereby producing a material such that the surface of a stainless steel was coated with an intermediate layer containing elements composing the Fe/Cr/Ni oxide layer and Au (thickness: 0.030 μm) and with an Au film (thickness: 0.08 μm).

Comparative Example 7

Except that the deposition time was reduced and an Au film having a thickness of 0.020 μm was deposited in Experimental Example 4, a similar processing to that of Experimental Example 4 was performed, thereby producing a material such that the surface of a base formed of a stainless steel was coated with an intermediate layer containing elements composing the Fe/Cr/Ni oxide layer and Au (thickness: 0.065 μm) and with an Au film (thickness: 0.020 μm).

Results of anticorrosiveness and electrical conductivity for each material are summarized in Table 1.

TABLE 1

|  | anticorrosiveness | | electrical conductivity |
| --- | --- | --- | --- |
|  | 1000 hours | 1500 hours | (Ω) |
| Experimental Example 1 | No rust occurs | No rust occurs | 0.01 to 0.02 |
| Experimental Example 2 | No rust occurs | Rust spots (3 or more) | 0.01 to 0.02 |
| Experimental Example 3 | No rust occurs | No rust occurs | 0.02 to 0.03 |
| Experimental Example 4 | No rust occurs | No rust occurs | 0.01 to 0.02 |
| Experimental Example 5 | No rust occurs | No rust occurs | 0.01 to 0.02 |
| Comparative Example 1 | Rust spots (20 or more) | Portion of Au film peels Rust occurs in steel | 0.05 to 0.06 |
| Comparative Example 2 | Portion of Au coating peels Large rust occurs in steel | Large rust occurs in steel | 0.05 to 0.06 |
| Comparative Example 3 | Rust spots (10 or more) | Portion of Pt film peels | 0.05 to 0.06 |
| Comparative Example 4 | Rust spots (15) | Portion of Au coating peels Rust occurs in steel | 0.01 to 0.02 |
| Comparative Example 5 | Rust spots (5) | Increased rust spots (20 or more) | 0.05 to 0.06 |
| Comparative Example 6 | Rust spots (3) | Increased rust spots (10 or more) | 0.04 to 0.06 |
| Comparative Example 7 | No rust occurs | A few rust spots | 0.05 to 0.06 |

As shown in Table 1, all of the materials of Experimental Examples 1 to 3, in which the surface of a base formed of a stainless steel is coated with a predetermined intermediate layer and metal film of appropriate thicknesses, have a good anticorrosiveness and electrical conductivity.

On the other hand, in the materials of Comparative Examples 1 to 3, in which the Fe/Cr/Ni oxide layer is completely removed, rust spots occurred and/or the metal film peeled.

Moreover, in both Comparative Example 4 (in which the thickness of the intermediate layer is below the preferable range) and Comparative Example 5 (in which the thickness of the metal film is below the preferable range), rust was observed in 1000 hours after immersion. Furthermore, electrical conductivity deteriorated in Comparative Example 5.

Although the metal film was deposited by using an arc ion plating treatment in the above Experimental Examples, this is no limitation. It has been experimentally confirmed that similar results are also obtained with other vapor deposition techniques.

INDUSTRIAL APPLICABILITY

A separator for a fuel cell according to the present invention has a good anticorrosiveness and electrical conductivity, and therefore can be broadly used for power sources for automobiles, power sources for mobile devices, distributed generation sources, and the like.

The invention claimed is:

1. A method of producing a fuel cell separator, comprising:
a step of providing a base formed of a steel which contains 10.5 mass % or more of Cr, with an oxide layer being formed on at least a portion of a surface thereof, the oxide layer containing oxides of Fe and Cr;
a step of, through an ion bombard process, removing a portion of the oxide layer so as to leave a portion of the oxide layer;
a step of forming an intermediate layer containing an element contained in the oxide layer and an element composing a metal film; and
a step of, by a vapor deposition technique, depositing the metal film on the intermediate layer,
wherein a depth-direction profile showing an oxygen content in the intermediate layer has a local maximum, and
wherein the local maximum occurs within the intermediate layer.

2. The method of producing a fuel cell separator of claim 1, wherein, through the ion bombard process, a portion is removed from the surface of the oxide layer to a depth of 0.0010 μm or more.

3. The method of producing a fuel cell separator cell of claim 1, wherein the step of forming the intermediate layer alternately performs a step of depositing the metal film and a step of performing an ion bombardment process.

4. The method of producing a fuel cell separator of claim 1, wherein the vapor deposition technique is a sputtering technique or an ion plating technique.

5. The method of producing a fuel cell separator cell of claim 1, wherein the metal film is composed of Au or Pt.

* * * * *